United States Patent
Smith et al.

(10) Patent No.: US 7,132,372 B2
(45) Date of Patent: Nov. 7, 2006

(54) METHOD FOR PREPARING A SEMICONDUCTOR SUBSTRATE SURFACE FOR SEMICONDUCTOR DEVICE FABRICATION

(75) Inventors: Steven M. Smith, Gilbert, AZ (US); Diana J. Convey, Laveen, AZ (US); Andy E. Hooper, Phoenix, AZ (US); Yi Wei, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 274 days.

(21) Appl. No.: 10/901,589

(22) Filed: Jul. 29, 2004

(65) Prior Publication Data

US 2006/0024970 A1   Feb. 2, 2006

(51) Int. Cl.
 *H01L 21/31* (2006.01)
(52) U.S. Cl. ............ 438/767; 438/287; 438/906; 257/E21.229
(58) Field of Classification Search .......... 438/46, 438/77, 93, 216, 287, 285, 767, 906, FOR. 156, 438/FOR. 404; 257/E21.229
See application file for complete search history.

(56) References Cited

U.S. PATENT DOCUMENTS

| | | | | |
|---|---|---|---|---|
| 5,981,319 | A * | 11/1999 | Lothian et al. | 438/167 |
| 6,042,975 | A * | 3/2000 | Burm et al. | 430/22 |
| 6,562,728 | B1 | 5/2003 | Hirose | |
| 6,589,349 | B1 * | 7/2003 | Kashiwagi et al. | 118/708 |
| 2002/0119607 | A1 * | 8/2002 | Miyasaka et al. | 438/151 |
| 2002/0151154 | A1 * | 10/2002 | Yamazaki et al. | 438/502 |
| 2002/0197785 | A1 * | 12/2002 | Yamazaki et al. | 438/225 |
| 2004/0101625 | A1 * | 5/2004 | Das et al. | 427/378 |
| 2004/0108575 | A1 * | 6/2004 | Ohmi et al. | 257/627 |

OTHER PUBLICATIONS

Gan et al., "Scanning tunneling microscopy of chemically cleaned germanium (100) surfaces," *Surface Science*, vol. 395, pp. 69-74, 1998.
Hovis et al., "Preparation of clean and atomically flat germanium (001) surfaces," *Surface Science*, vol. 440, pp. L815-L819, 1999.
Poelman et al., "Chemical surface passivation of low resisitivity p-type Ge wafers for solar cell applications," *Solar Energy Materials & Solar Cells*, vol. 76, pp. 167-173, 2003.
Roche et al., "Core level photoemission studies of the sulphur terminated Ge(100) surface," *Applied Surface Science*, vol. 174, pp. 271-274, 2001.
Zhang et al., "Thermal desorption of ultraviolet-ozone oxidized Ge(001) for substrate cleaning," *J. Vac. Sci. Technol. A*, vol. 11, No. 5, pp. 2553-2561, Sep./Oct. 1993.

* cited by examiner

*Primary Examiner*—George Fourson
(74) *Attorney, Agent, or Firm*—K. Brook Coleman

(57) ABSTRACT

A method for preparing a semiconductor substrate surface (28) for semiconductor device fabrication, includes providing a semiconductor substrate (20) having a pure Ge surface layer (28) or a Ge-containing surface layer (12), such as SiGe. The semiconductor substrate (20) is cleaned using a first oxygen plasma process (14) to remove foreign matter (30) from the surface (28) of the substrate (20). The substrate surface (28) is next immersed in a hydrochloric acid solution (16) to remove additional foreign matter (30) from the surface (28) of the substrate (20). The immersion step is followed by a second oxygen plasma etch process (18), passivate the surface with a passivation layer (34), and provide for an atomically smooth surface for subsequent epitaxial or gate dielectric growth.

24 Claims, 3 Drawing Sheets

5 μm

5 μm

5 μm

5 μm

METHOD FOR PREPARING A SEMICONDUCTOR SUBSTRATE SURFACE FOR SEMICONDUCTOR DEVICE FABRICATION

FIELD OF THE DISCLOSURE

This disclosure relates generally to a method for preparing a semiconductor substrate surface for semiconductor device fabrication. More specifically, this disclosure provides for a method for preparing a Ge or Ge-containing semiconductor substrate surface for subsequent epitaxial or gate dielectric growth.

BACKGROUND OF THE DISCLOSURE

Germanium surfaces, and more particularly Ge (100) surfaces, have received little attention over the past few decades due to the great success of silicon (Si) based complementary metal oxide semiconductor (CMOS) technology. There now exists a surging interest in Ge based field-effect transistors (FET) where Si cleaning techniques do not apply. This makes the preparing of Ge and/or Ge-containing surfaces for semiconductor device fabrication, such as epitaxial and gate dielectric growth processes, very important. Ge surface cleaning typically includes oxide removal, carbon removal, metallic surface contamination, and the like, and is very important for heterogeneous integration schemes, as well as Ge-containing surfaces, such as SiGe materials which have greater than twenty five percent (>25%) Ge at the surface.

One aspect of heterogeneous integration is epitaxial growth on Ge single crystal substrate. Providing a clean and well passivated surface, such as one passivated with $GeO_2$, becomes important for meeting epitaxial growth requirements. If the surface cleaning is insufficient, impurity elements such as oxygen, carbon, and metal are left over on the surface, and can lead to stacking faults or point defects, leading to poor electrical device performance. In the past, researchers have used several methods or processes for the preparation of Ge and Ge-containing surfaces with various levels of success. One of these methods is a cyclic wet cleaning method which typically produces rough surfaces having high carbon levels leading to growth-related nucleation defects.

Others have used UV-ozone processes to clean carbon from the surface and produce a $GeO_2$ passivation layer. The UV-ozone processes, however, do not address the removal of surface metallic contaminants. In addition, the UV-ozone process is lengthy and while it creates a smooth surface void of carbon, it produces a lower density oxide consistent with a higher $GeO_x/GeO_2$ ratio, where $O<x<2$. Furthermore, wafer fab tools built to handle large batch sizes using this UV-ozone process are not readily available. Still further, chemical surface termination processes have also been utilized to prepare Ge based surfaces, yet have proved difficult to produce a stable passivated surface.

Therefore, a need exists for a method of preparing a Ge or Ge-containing semiconductor substrate surface for subsequent semiconductor device fabrication, such as epitaxial growth or gate dielectric growth.

SUMMARY OF THE DISCLOSURE

According to one embodiment of the present disclosure, a method for preparing a Ge or Ge containing semiconductor substrate surface for semiconductor device fabrication including the steps of performing a first dry cleaning process, followed by a wet cleaning process, that is subsequently followed by a second dry cleaning process to remove foreign matter and passivate the surface with a passivation layer. This process sequence provides for the enhancement of $GeO_2$ formation, while achieving an atomically smooth surface. The method of preparing the Ge surface or Ge-containing surface further provides for a surface void of contamination and an optimal Ge surface ready for epi-growth.

BRIEF DESCRIPTION OF THE DRAWINGS

The present disclosure is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE PREFERRED EMBODIMENTS

A method of preparing a germanium (Ge), or germanium (Ge)-containing, semiconductor substrate surface for the subsequent growth of epitaxial layers or a gate dielectric is disclosed. More specifically, disclosed is a new method of preparing the surface of the substrate material utilizing a three-step dry/wet/dry cleaning process to remove impurities and form an atomically smooth passivating surface layer. Accordingly, a method for preparing a Ge surface, or Ge-containing surface of a semiconductor substrate is illustrated in FIGS. 1–9.

According to an embodiment of the present disclosure, a method of preparing a Ge or Ge containing semiconductor substrate surface for epitaxial and gate dielectric growth processes provides for a dense, high purity, atomically smooth $GeO_2$ layer on the surface.

According to an embodiment of the present disclosure, a method of preparing a Ge or Ge containing semiconductor substrate surface for epitaxial and gate dielectric growth processes provides for the elimination of carbon, reduction of surface metallics, and growth of an oxide passivation layer.

According to an embodiment of the present disclosure, a method of preparing a Ge or Ge containing semiconductor substrate surface for epitaxial and gate dielectric growth processes provides for a highly manufacturable process, utilizing current high-volume processing toolsets for faster cycle times when compared to previous surface cleaning techniques.

Figure 1:
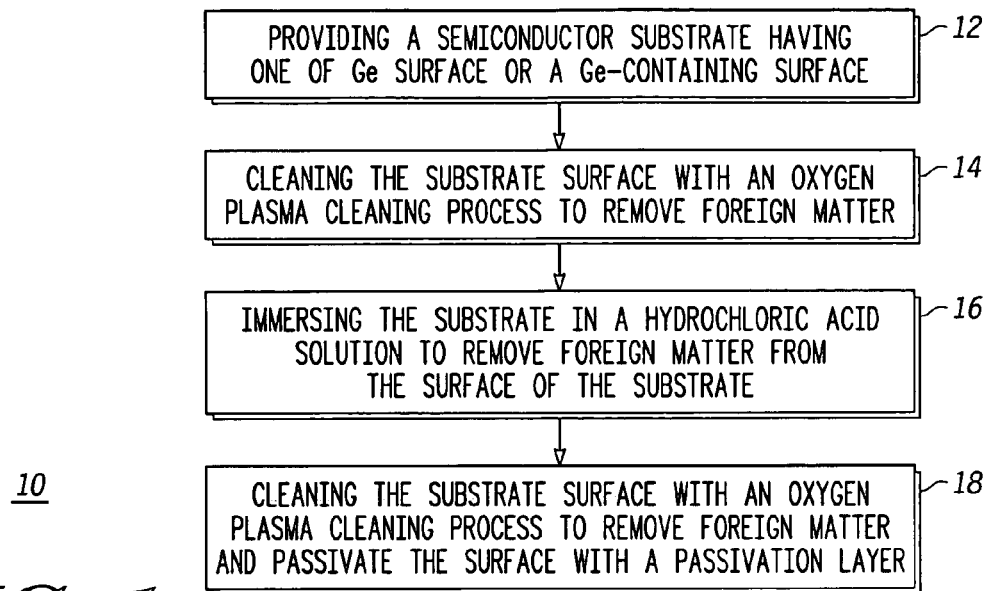
FIG. 1 is a flowchart showing a method of preparing a semiconductor substrate surface according to the present disclosure.

Turning now to the drawings, illustrated in FIG. 1, is a flowchart showing a method 10 of preparing a semiconductor substrate having a Ge surface, or Ge-containing surface according to the present disclosure. The method as disclosed in FIG. 1, comprises the steps of: (i) providing a semiconductor substrate having one of a Ge surface, or a Ge-containing surface 12; (ii) exposing the substrate surface to a first oxygen plasma cleaning process, thereby removing foreign matter from the surface 14; (iii) immersing the substrate in a solution of hydrochloric acid and water to remove foreign matter from the surface of the substrate 16; and (iv) exposing the substrate surface to a second oxygen plasma cleaning step, thereby removing additional foreign matter and passivating the surface with an oxide layer 18.

A first example discloses a method of preparing a semiconductor substrate having a pure Ge substrate and having formed on the surface, foreign matter, including an oxide material or layer, comprised of a germanium oxide ($GeO_2$), a sub-oxide of germanium monoxide (GeO), metal impurities, and carbon impurities. The oxide layer is typically formed as a native oxide. The substrate is formed of a single layer of monocrystalline Ge. The term "monocrystalline" shall have the meaning commonly used within the semiconductor industry. The term "monocrystalline" shall refer to materials that are a single crystal or that are substantially a single crystal. The term "monocrystalline" shall include those materials having a relatively small number of defects such as dislocations and the like, commonly found in substrates of silicon or germanium or mixtures of silicon and germanium. A second method discloses a method of preparing a semiconductor structure having a silicon (Si) base layer and a layer of silicon dioxide ($SiO_2$) thereon. A layer of Ge is formed on the $SiO_2$, defining a typical germanium-on-insulator (GOI) substrate. In addition, it is anticipated by this disclosure that the substrate may be a Ge-containing material, having additional materials, such as silicon, included as a part thereof and forming a Ge-containing surface.

Figure 2:
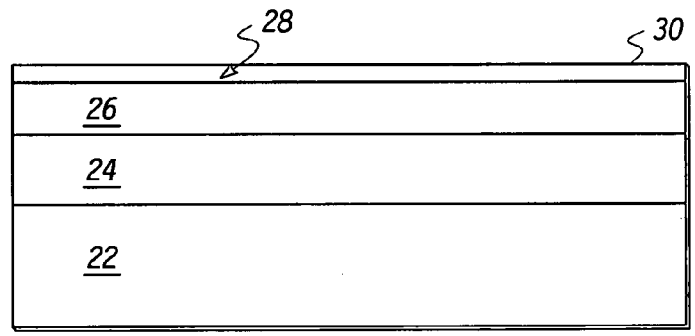
FIGS. 2–4 illustrate in sectional views, a semiconductor structure formed according to the method of the present disclosure.
Figure 3:
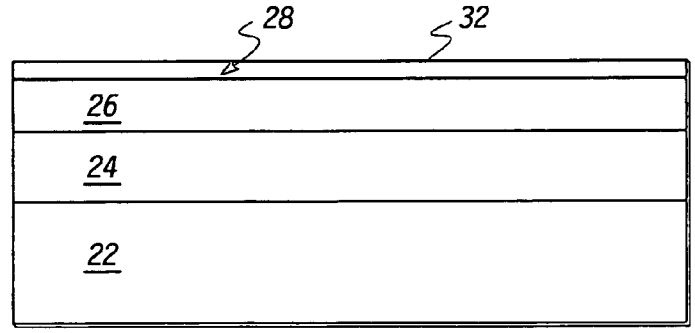
Figure 4:
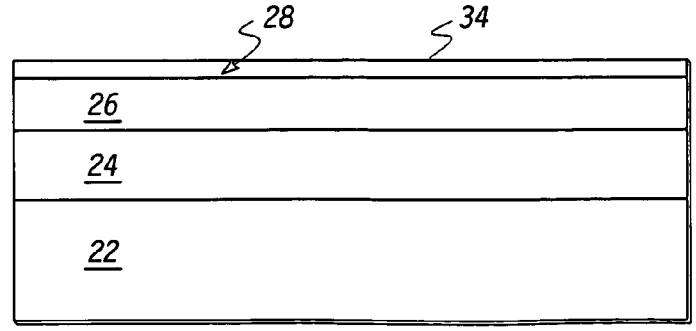

Referring now to FIGS. 2–4, illustrated is a semiconductor structure 20 comprised of a silicon material 22 having an oxide layer 24, and a layer of Ge 26 formed thereon, defining a typical GOI structure. On an uppermost surface 28 of Ge layer 26 is found foreign matter 30, generally comprised of carbon impurities, and an oxide material, namely $GeO_2$ and GeO, as previously described. As previously stated, skilled artisans will appreciate that elements in the figures are illustrated for simplicity and clarity and have not necessarily been drawn to scale.

Semiconductor substrate structure 20 as illustrated in FIG. 3, undergoes a first oxygen plasma cleaning step to provide for the removal of foreign matter 30, namely the carbon (C) impurities. During this cleaning process, a plasma oxide material 32 is deposited, causing an increase in the surface $GeO_2$ fraction, making the surface oxide layer more amenable to a subsequent hydrochloride cleaning step. Oxygen plasma cleaning uses a chemical process in which oxygen radicals are formed and organic contaminates are chemically oxidized. More specifically, during this step, substrate 22 is exposed to chemically active oxygen species (radicals and ions) that are generated by molecular oxygens proximate to an electric field, typically produced by a tunable R.F. generator. The plasma also produces various high-energy particles that are unwanted due to their strong surface bombardment effect, therefore a remote plasma design or one utilizing a shielded cage is preferred to minimize damage from high energy particles. When exposed to the low energy chemically active oxygen species, Ge surface 28 becomes oxidized, wherein the unwanted carbon-containing species are removed and the GeOx (where 1<x<2) is further oxidized. The surface oxidation becomes self-limiting at about 2 nm thick, as longer oxygen plasma exposure time and increased power levels have shown no measurable differences by AES depth profiling. Plasma power, substrate temperature, and pressure regimes are optimized based on plasma system configurations. A single wafer remote plasma design and an R.F. shielded batch wafer design have both been tested with no measurable differences being noted.

Next, the partially cleaned substrate 20 is immersed in a solution of hydrochloric acid and water to provide for further removal of any remaining foreign matter from the substrate surface 28, including surface oxide and intermetallics. More specifically, immersing the substrate in a solution of hydrochloric acid and water provides for the removal of surface metallics, such as nickel, titanium, or the like, carbon, and the etching away of at least a portion of oxide materia 32. In most instances, some germanium monoxide material remains on the surface of the substrate 20. In one embodiment, the solution of hydrochloric acid and water used in this step preferably contains 37% hydrochloric acid by weight and pure water at a ratio preferably of 4 parts water to one part hydrochloric acid. If the solution of hydrochloric acid to water exceeds the preferred 4:1 ratio, then the time in which surface 28 of substrate 22 is immersed in the solution will need to be decreased. If the solution of hydrochloric acid to water is less than the preferred 4:1 ratio, then this processing step will take too much time, and the foreign matter will not be sufficiently removed. It is anticipated by this disclosure that any dilute aqueous hydrochloric acid can be utilized with the exposure time optimized based on the concentration levels of the acid.

Lastly, as illustrated in FIG. 4, substrate 22 undergoes a second oxygen plasma cleaning step, similar to the first plasma cleaning step. This repeat oxygen plasma cleaning step removes any remaining foreign matter, such as carbon, and re-oxidizes the remaining GeO 32, thereby forming a passivating layer 34 of germanium oxide ($GeO_2$). The $GeO_2$ passivates surface 28 with the germanium oxide ($GeO_2$) passivation layer 34 having a high $GeO_2$ fraction. Substrate 22 undergoes this final process step on a batch-style barrel reactor with a perforated metal shield protecting the Ge substrate from high energy particles. The process conditions were 1000 watts R.F. power for 15 minutes, with $O_2$ flow rates set at 0.6 slm and chamber pressure at 1.0 Torr.

Typically, $O_2$ plasma chemistries on Si surfaces produce roughened surfaces. Accordingly, $O_2$ plasmas are considered aggressive for surface modifications. However, with respect to Ge, or Ge-containing surfaces, the use of higher R.F. power during an $O_2$ plasma results in surface modifications that actually produce smoother surfaces. Likewise, a cyclic process consisting of high power $O_2$ plasma followed by wet chemical stripping of the surface $GeO_2$ layer in $HCl/H_2O$ solutions, and then repeating the high power RF $O_2$ plasma process makes for even smoother films. The $O_2$ plasma serves to eliminate the high levels of carbon typically observed on Ge surfaces, which bodes well for subsequent epi growth. As a result of the use of the multiple $O_2$ plasma processes in combination with the intermediate hydrochloric acid solution wet processing, an anatomically smooth Ge surface is formed and provides for subsequent pre-epitaxial or gate dielectric growth to form a semiconductor device.

Figure 5:
FIG. 5 is a microscopic photograph showing the surface of a Ge (100) substrate without surface preparations as a comparative example.
Figure 6:
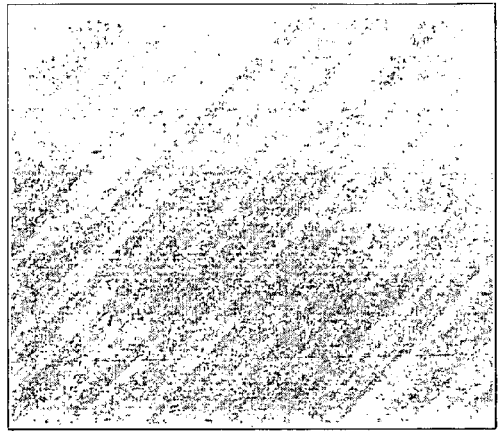
FIG. 6 is a microscopic photograph showing the surface of a Ge (100) substrate having a surface prepared by the method of preparing a semiconductor surface for semiconductor device fabrication according to the present disclosure.

Referring now to FIGS. 5 and 6, illustrated are microscopic photographs showing the surface of a Ge (100) substrate having an unprepared surface, and a surface prepared, or cleaned, by the method of preparing a semiconductor surface for semiconductor device fabrication according to one embodiment of the present disclosure, respectively. As illustrated by FIG. 6, preparing the surface with use of the dry/wet/dry cleaning technique as disclosed herein, results in substantially no roughness induced by the cleaning process. As illustrated in FIG. 6, striations on the surface are a result of the surface polishing performed by the substrate manufacturer. The net increase in surface roughness (RMS) value is 0.13 nm.

Figure 7:
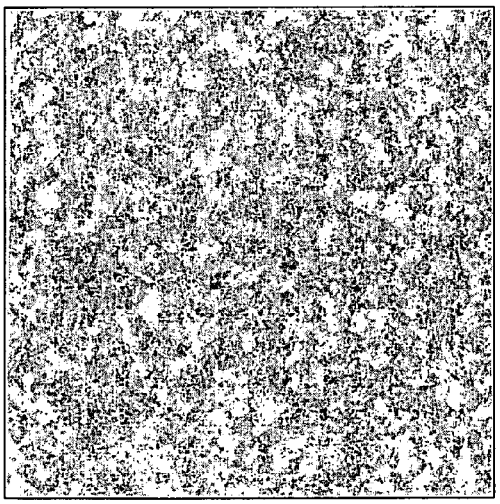
FIG. 7 is a microscopic photograph showing the surface of a germanium-on-insulator (GOI) substrate without surface preparations as a comparative example.
Figure 8:
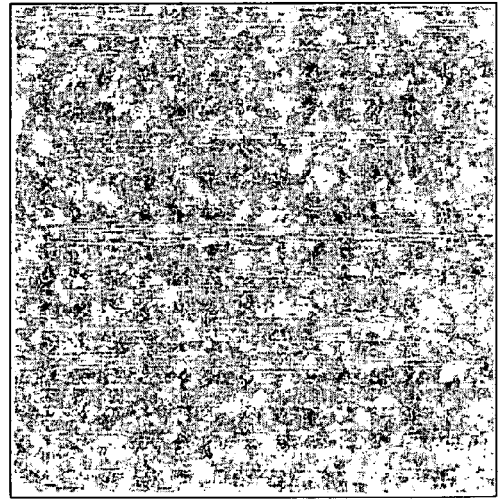
FIG. 8 is a microscopic photograph showing the surface of a germanium-on-insulator (GOI) substrate having a surface prepared by the method of preparing a semiconductor surface for semiconductor device fabrication according to the present disclosure.

Referring now to FIGS. 7 and 8, illustrated are microscopic photographs showing the surface of a GOI device, as previously described, having an unprepared surface, and a surface prepared by the method of preparing a semiconductor surface for semiconductor device fabrication according to one embodiment of the present disclosure, respectively. As illustrated by FIG. 8, preparing the surface with use of the dry/wet/dry cleaning technique as disclosed herein, results in the surface remaining atomically smooth even for an alternatively produced (GOI) surface.

Figure 9:
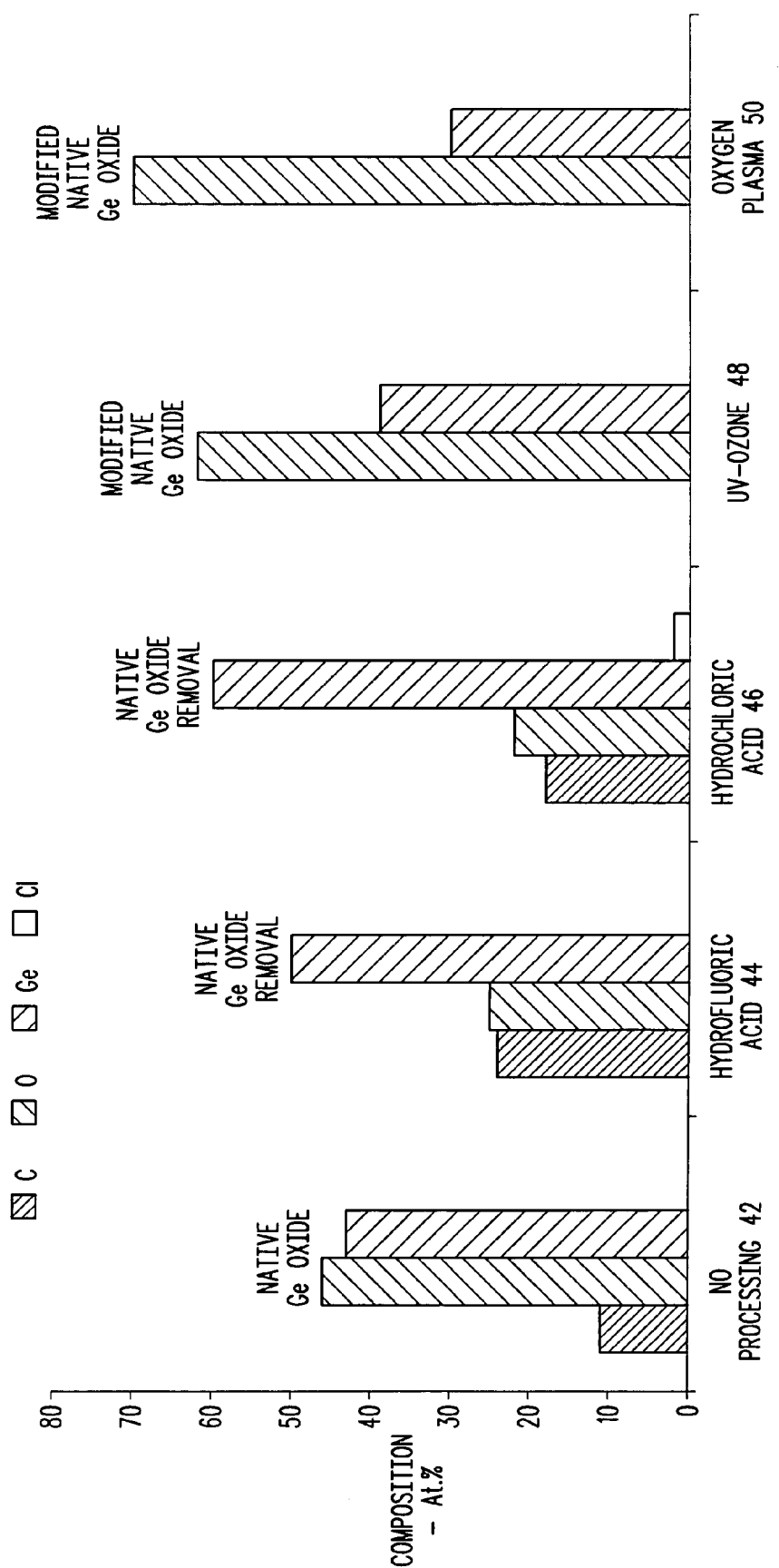
FIG. 9 is a data chart illustrating Ge surface composition analysis of a Ge surface treated using one of various surface treatment processes and Auger Electron Spectroscopy (AES).

Referring now to FIG. 9, illustrated is a data chart 40 showing Ge surface composition analysis of a Ge surface treated using various surface treatment (wet chemical) processes and Auger Electron Spectroscopy (AES). More specifically, AES data shows high carbon levels for wet chemical processes, which produce unstable Ge surfaces that "getter" carbon. Whereas, oxygen plasma processing removes carbon and provides an oxygen rich surface. Oxygen plasma processing results in a highly oxidized $GeO_2$ surface. In addition, metallic contamination levels have been observed to drop after processing a surface with the dry/wet/dry cleaning technique embodiments of the present disclosure. Furthermore, the $O_2$ plasma of the present embodiments removes surface carbon and produces $GeO_2$ faster than UV-ozone methods. Accordingly, the $O_2$ plasma provides a faster cycle time that benefits manufacturing.

As illustrated in FIG. 9, for a surface treated with no processing 42, the composition (in At. %) was found to be approximately 12 At. % carbon, approximately 46 At. % oxygen, and approximately 44 At. % germanium. For hydrofluoric acid processing 44, the surface was found to be approximately 22 At. % carbon, approximately 24 At. % oxygen, and approximately 50 At. % germanium. For hydrochloric acid processing 46, the surface was found to be approximately 18 At. % carbon, approximately 22 At. % oxygen, approximately 60 At. % germanium, and approximately 2 At. % chlorine. For UV-ozone processing 48, the surface was found to be approximately 64 At. % oxygen and approximately 38 At. % germanium. For plasma oxide processing 50, the surface was found to be approximately 72 At. % oxygen and 30 At. % germanium.

Thus, it is apparent that there has been provided, in accordance with the disclosure, a method for preparing a semiconductor substrate having a surface layer comprised of one of Ge or a Ge-containing material that fully meets the advantages set forth previously. Although the disclosure has been described and illustrated with reference to specific embodiments of the method thereof, it is not intended that the disclosure be limited to these illustrative embodiments. Those skilled in the art will recognize that modifications and variations can be made without departing from the spirit of the disclosure. For example, variations in processing times and temperatures may vary. Therefore, it is intended that this disclosure encompass all such variations and modifications as fall within the scope of the appended claims.

We claim:

1. A method for preparing a semiconductor substrate surface for semiconductor device fabrication, the method comprising:
    cleaning a substrate having a surface layer comprised of at least one of Ge and a Ge-containing material with a first oxygen plasma process to remove foreign matter from the surface of the substrate;
    immersing the substrate in a solution of hydrochloric acid to remove foreign matter from the surface of the substrate; and
    cleaning the substrate surface with a second oxygen plasma process to remove foreign matter and to passivate the surface with a passivation layer.

2. A method for preparing a semiconductor substrate surface for semiconductor device fabrication as claimed in claim 1 wherein the semiconductor substrate comprises pure germanium (Ge).

3. A method for preparing a semiconductor substrate surface for semiconductor device fabrication as claimed in claim 1 wherein the semiconductor substrate comprises a germanium on insulator (GOI) substrate.

4. A method for preparing a semiconductor substrate surface for semiconductor device fabrication as claimed in claim 1, wherein the semiconductor substrate comprises a combination of germanium (Ge) and silicon (Si).

5. A method for preparing a semiconductor substrate surface for semiconductor device fabrication as claimed in claim 1, wherein the solution of hydrochloric acid comprises four parts water to 1 part hydrochloric acid.

6. A method for preparing a semiconductor substrate surface for semiconductor device fabrication as claimed in claim 5, wherein the substrate is immersed in the solution of hydrochloric acid at room temperature for at least one minute.

7. A method for preparing a semiconductor substrate surface for semiconductor device fabrication as claimed in claim 1, further comprising completing the first oxygen plasma cleaning prior to immersing the substrate in the hydrochloric acid solution.

8. A method for preparing a semiconductor substrate surface for semiconductor device fabrication as claimed in claim 7, wherein the substrate undergoes the first oxygen plasma cleaning step for fifteen minutes.

9. A method for preparing a semiconductor substrate surface for semiconductor device fabrication as claimed in claim 8, further comprising completing the second oxygen plasma cleaning step subsequent to immersing the substrate in the hydrochloric acid solution.

10. A method for preparing a semiconductor substrate surface for semiconductor device fabrication as claimed in claim 9, wherein the substrate undergoes the second oxygen plasma cleaning step for fifteen minutes.

11. A method for preparing a semiconductor substrate surface for semiconductor device fabrication as claimed in claim 1, wherein the foreign matter includes oxides, metal impurities, and carbon impurities to be removed from the surface of the substrate during the method and wherein the passivation layer includes GeO$_2$ formed on the surface of the substrate.

12. A method for preparing a semiconductor substrate surface for semiconductor device fabrication, the method comprising:

exposing a substrate having a surface layer comprised of at least one of Ge and a Ge-containing material to an oxygen plasma to remove foreign matter from the surface of the substrate and to oxidize the surface;

immersing the substrate surface in a solution of four parts water and one part hydrochloric acid to remove surface metallics and a portion of the oxide from the surface of the substrate; and exposing the substrate surface a second time to an oxygen plasma to remove foreign matter and to re-oxidize a remaining oxide for forming a passivation layer on the surface of the substrate.

13. A method for preparing a semiconductor substrate surface for semiconductor device fabrication as claimed in claim 12, wherein the semiconductor substrate comprises pure germanium (Ge).

14. A method for preparing a semiconductor substrate surface for semiconductor device fabrication as claimed in claim 12, wherein the semiconductor substrate comprises a germanium on insulator (GOI) substrate.

15. A method for preparing a semiconductor substrate surface for semiconductor device fabrication as claimed in claim 12, wherein the semiconductor substrate comprises a combination of germanium (Ge) and silicon (Si).

16. A method for preparing a semiconductor substrate surface for semiconductor device fabrication as claimed in claim 12, wherein the foreign matter includes oxides, surface metallics, and carbon impurities to be removed from the surface of the substrate during the method and wherein the passivation layer includes GeO$_2$ formed on the surface.

17. A method for preparing a semiconductor substrate surface for semiconductor device fabrication as claimed in claim 12, wherein the substrate is immersed in the solution of hydrochloric acid at room temperature for at least one minute.

18. A method for fabricating a semiconductor device, the method comprising:

providing a substrate having a surface layer comprised of one of Ge and a Ge-containing material;

cleaning the surface layer of the substrate with a first oxygen plasma cleaning process to remove foreign matter from the surface of the substrate;

immersing the substrate in a solution of hydrochloric acid and water to remove additional foreign matter and oxide from the surface of the substrate;

cleaning the surface of the substrate with a second oxygen plasma cleaning process to remove foreign matter and to re-oxidize any remaining oxide for forming an oxide layer to passivate the surface; and epitaxially growing one or more semiconductor layers of the semiconductor device on an uppermost surface of the oxide passivation layer.

19. A method for fabricating a semiconductor device as claimed in claim 18, wherein the semiconductor substrate comprises pure germanium (Ge).

20. A method for fabricating a semiconductor device as claimed in claim 18, wherein the semiconductor substrate comprises a combination of germanium (Ge) and silicon (Si).

21. A method for fabricating a semiconductor device as claimed in claim 18, wherein the semiconductor substrate comprises a germanium-on-insulator (GOI) substrate.

22. A method for fabricating a semiconductor device as claimed in claim 18, further comprising completing the first oxygen plasma cleaning step prior to immersing the substrate into the solution of hydrochloric acid and water.

23. A method for fabricating a semiconductor device as claimed in claim 18, further comprising completing the second oxygen plasma cleaning step subsequent to immersing the substrate into the solution of hydrochloric acid and water.

24. A method for fabricating a semiconductor device as claimed in claim 18, wherein the foreign matter includes one or more oxides, metal impurities, and carbon impurities to be removed from the surface of the substrate during the method and wherein the passivation layer includes GeO$_2$ formed on the surface of the substrate.

* * * * *